US007519341B2

(12) United States Patent
Doudnikoff et al.

(10) Patent No.: US 7,519,341 B2
(45) Date of Patent: *Apr. 14, 2009

(54) RADIO STATION PREFERENCE TRANSLATIONAL MAPPING

(75) Inventors: Gregory Michael Doudnikoff, Raleigh, NC (US); Doreen L. Galli, Pembroke Pines, FL (US); Steven Michael Miller, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/098,109

(22) Filed: Apr. 4, 2008

(65) Prior Publication Data
US 2008/0188193 A1 Aug. 7, 2008

Related U.S. Application Data

(63) Continuation of application No. 11/190,401, filed on Jul. 27, 2005, now Pat. No. 7,379,721.

(51) Int. Cl.
*H04B 1/18* (2006.01)
*H04H 60/09* (2008.01)
*H04Q 7/20* (2006.01)

(52) U.S. Cl. ............... 455/185.1; 455/186.1; 455/3.04; 455/432.3; 455/456.3

(58) Field of Classification Search ............ 455/179.1, 455/185.1, 186.1, 3.03, 3.04, 432.2, 456.3
See application file for complete search history.

(56) References Cited

U.S. PATENT DOCUMENTS

| | | | |
|---|---|---|---|
| 5,633,484 A | 5/1997 | Zancho et al. ............... 235/380 |
| 5,898,910 A | 4/1999 | Miyake et al. ............ 455/186.1 |
| 6,248,946 B1 * | 6/2001 | Dwek ........................... 84/609 |
| 6,374,177 B1 | 4/2002 | Lee et al. ..................... 701/200 |
| 6,445,306 B1 | 9/2002 | Trovato et al. ......... 340/825.24 |
| 6,526,411 B1 * | 2/2003 | Ward ........................... 707/102 |
| 6,725,022 B1 | 4/2004 | Clayton et al. ........... 455/154.1 |
| 6,865,600 B1 * | 3/2005 | Brydon et al. ............... 709/219 |
| 7,076,202 B1 | 7/2006 | Billmaier ................... 455/3.04 |
| 7,171,174 B2 | 1/2007 | Ellis et al. ................... 455/132 |
| 7,251,452 B2 | 7/2007 | Stumphauzer, II ......... 455/3.06 |
| 7,340,761 B2 * | 3/2008 | Billmaier ...................... 725/49 |
| 7,343,384 B2 * | 3/2008 | Plastina et al. ........... 707/104.1 |
| 7,412,202 B2 * | 8/2008 | Gutta et al. ................ 455/3.01 |
| 2002/0054134 A1 * | 5/2002 | Kelts .......................... 345/788 |

(Continued)

*Primary Examiner*—Duc M Nguyen
(74) *Attorney, Agent, or Firm*—VanLeeuwen & VanLeeuwen

(57) ABSTRACT

A user's media preferences can be obtained and stored for later use in setting up a currently-available media device. The media device inputs are programmed based on the media device's capabilities and the available media sources for the particular geographic area in which the user is currently located. Media device inputs may be set by the media device itself or by a computer attached to the media device, either directly or via a network. Device data, including information such as the number of media device inputs to be programmed, and whether or not the media device inputs can be toggled between several stations, is obtained. Station data, including available media sources, is obtained for the current geographic area. A user profile, including information such as input preference settings and genre preferences, is also obtained. The media device inputs are then programmed based on the user profile, the station data for the geographic area, and the media device capabilities.

16 Claims, 9 Drawing Sheets

Device Input Examples
800

U.S. PATENT DOCUMENTS

| | | | |
|---|---|---|---|
| 2002/0142722 A1 | 10/2002 | Gutta et al. | 455/45 |
| 2003/0013425 A1 | 1/2003 | Nee | 455/186.1 |
| 2003/0083028 A1 | 5/2003 | Williamson | 455/186.1 |
| 2006/0195516 A1* | 8/2006 | Beaupre | 709/203 |

* cited by examiner

810

| Rock<br>105.9 FM | Rock<br>93.3 FM | Rock<br>102.7 FM | Rock<br>100.5 FM | Rock<br>88.1 FM | Rock<br>89.5 FM |

820

| News<br>99.3 FM | Jazz<br>93.9 FM | Rock<br>105.9 FM | Rock<br>93.3 FM | Easy<br>105.1 FM | Country<br>106.5 FM |

830

| News<br>92.5 FM<br>98.7 FM<br>1190AM<br>1024.5 SAT | Jazz<br>988.5 SAT<br>91.7 FM<br>88.9 FM<br>690 AM | Alt<br>102.9 FM<br>100.7 FM<br>1349.3 SAT | Rock<br>101.5 FM<br>98.7 FM<br>103.5 FM<br>104.7 FM<br>1152.7 SAT | Easy<br>93.9 FM | Country<br>96.1 FM<br>810 AM<br>950 AM<br>990.5 SAT |

Device Input Examples
800

*Figure 8*

RADIO STATION PREFERENCE TRANSLATIONAL MAPPING

RELATED APPLICATIONS

This application is a continuation application of co-pending U.S. Non-Provisional patent application Ser. No. 11/190,401, entitled "System and Method for Radio Station Preference Translational Mapping," filed on Jul. 27, 2005 now U.S. Pat. No. 7,379,721.

BACKGROUND OF THE INVENTION

1. Technical Field

The present invention relates in general to a system and method for setting media device inputs according to user preferences. In particular, the present invention maps radio station preferences to media device inputs based on user preferences and media device capabilities.

2. Description of the Related Art

In recent years, there has been a proliferation of media sources available to users. Radio stations, including both traditional and satellite radio stations, television stations, streaming media sources, and the like are becoming very popular and, in most geographic areas, users have a multitude of media sources from which to choose. Many users also have a variety of media devices available to them. In additional to traditional radios and televisions, users may choose to listen to music, or receive other forms of multimedia entertainment, on a variety of devices, including pervasive devices such as personal digital assistants (PDAs), cell phones, portable computers, etc. Service companies, such as car rental agencies and hotels, frequently provide customers with devices, such as radios, on which to receive radio and other multimedia entertainment.

The increasing number of media sources, coupled with the number of devices available to receive the offered media entertainment, is sometimes difficult for the average user to manage. For example, a user may wish to listen to certain types of music while driving, and may program his favorite radio stations on his car radio. As time goes on, there may be new radio stations available that the user would also enjoy, but of which he is unaware. When the user drives his car to another city, he may try to find local radio stations that he prefers, but this may be difficult and time-consuming, especially if there are many radio stations available in a particular geographic area. Similarly, when a user rents a car, he may wish to program the car radio buttons to stations that he enjoys, but may find that it is time-consuming to find stations that he enjoys and actually program these stations into the car radio buttons.

What is needed, therefore, is a system and method for setting media device inputs according to user preferences.

SUMMARY

It has been discovered that the foregoing challenges are solved by using a system and method that obtains a user's preferences, and uses these preferences to set media device inputs for the user. The media device inputs are programmed based on the media device's capabilities and the available media sources for the particular geographic area in which the user is currently located.

Media device inputs may be set by the media device itself or by a computer attached to the media device, either directly or via a network. Station data is obtained for the current geographic area. The station data includes available media sources, typically sorted by genre type and popularity. A user profile is also obtained. The user profile is portable, and the user may carry it with him on a smart card, or it may be stored in a device such as a cell phone or PDA. The user profile may also be obtained through a computer network, such as via a web interface. The user profile includes information such as input preference settings and genre preferences.

Device data, including information such as the number of media device inputs to be programmed, and whether or not the media device inputs can be toggled between several stations, is obtained, typically from the device itself. The media device inputs are then programmed based on the user preference settings, the station data for the geographic area, and the media device capabilities.

The media device inputs may be programmed in a variety of ways, depending on the user's preferences, the media device capabilities, and the available media sources. For example, each media device input may be programmed for input of the same genre. Alternately, each media device input may be programmed for input from different genre types. If the media device inputs are toggle-enabled, each media device input may be programmed to toggle through multiple stations, of either the same or different genres.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 8 is a diagram showing examples of programmed media device inputs;

DETAILED DESCRIPTION

Figure 1:
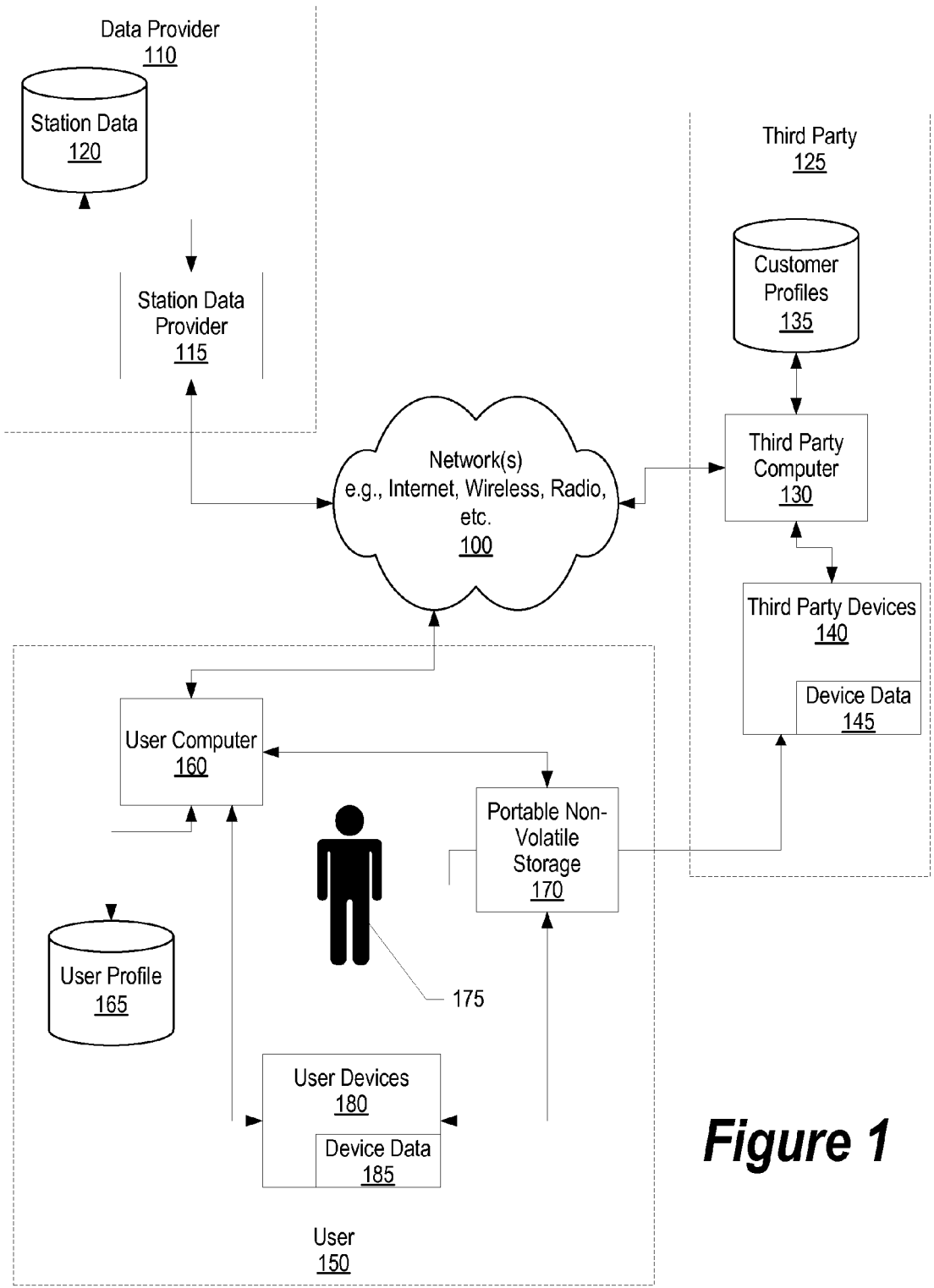
FIG. 1 is a network diagram showing the interactions between a data provider, a user, and a third party.

The following is intended to provide a detailed description of an example of the invention and should not be taken to be limiting of the invention itself. Rather, any number of variations may fall within the scope of the invention, which is defined in the claims following the description.

The invention is a method, system, and computer program product for setting media device inputs, such as the input buttons of a radio, according to user preferences and media device capabilities. The media device inputs may be set by the media device itself, for example, by a software program executing within a radio. Alternately, the media device inputs may be set by a computer attached, either directly or via a network, to the media device.

The media device inputs are set based on a user's preferences. User preferences are typically stored in a user profile and can include preference settings, such as whether a user prefers to have one radio station set per button, or multiple radio stations that can be toggled per button. The user may also indicate either a single genre preference or multiple genre preferences. When the user travels to a new geographic area, he is able to re-program media device inputs according to his personal preferences. For example, as a user drives from one city to another, he may request that the buttons on his car radio be set to radio stations in the current location. The car radio buttons will be set to particular radio stations based on the preferences stored in the user's profile, the capabilities of the user's car radio (e.g., whether or not multiple stations can be programmed per button), and the radio station data for local radio stations. Note that available stations may include satellite radio stations. A user may also choose to set, i.e. reset, media device inputs even when he has not traveled to a new geographic area. For example, the user may re-set his car radio buttons on a regular basis in order to always be sure to have the most popular radio stations available. As the availability of stations changes, as various stations come and go, and as popularity ratings change, the most up to date information will always be used to program the user's radio buttons. The user may reset his car radio buttons on a regular basis, or alternately, a computer program may be set up to automatically reset the car radio buttons at pre-defined time intervals.

As another example, when the user rents a car, he may also use his personal preferences to set the radio buttons on the rental car's radio. The rental car company may, for example, obtain the user's preferences via a web interface and program the rental car's radio stations for the user before he picks up his car. Alternately, the user may download or transmit his preferences to the rental car company's computer, or to the rental car radio itself, using a web interface, a wireless connection to a user device, such as a cell phone or PDA, or a smart card.

As yet another example, when the user checks into a hotel, the user's preferences may be used to set the radio stations of a radio in the user's hotel room. The hotel may keep a database of its customers' preferences, or the user may download or transmit his preferences to the hotel's computer or to the radio in his hotel room.

Note that the present invention is not limited to programming the buttons of a radio, but may include setting any type of media device inputs to receive any type of data. Media devices may include, but are not limited to, any portable device, handheld device, or pervasive device. The media device inputs may be programmed to receive input from media sources including, but not limited to, radio stations, satellite stations, television stations, and Internet streaming data.

FIG. 1 is a network diagram showing the interactions between a data provider, a user, and a third party. Data provider 110, third party 125, and user 150 are connected via network 100, which may be, for example, the Internet, an intranet, a virtual private network (VPN), a wireless network, a radio connection, etc. Data provider 110 includes station data provider 115, which provides station data 120 (described in further detail in FIG. 2) to requesters. Station data provider 115 may collect station data 120 or may obtain station data 120 from another source. Station data 120 may be stored in a variety of formats, preferably in a non-volatile storage, such as a disk storage device. Upon request, station data provider 115 provides station data 120 to requesters, such as user 150 and third party 125. Station data provider 115 may or may not charge a fee for providing station data 120 to requesters. Station data 120 may be provided in any number of formats, and may include all of station data 120 or a subset of such data.

Figure 3:
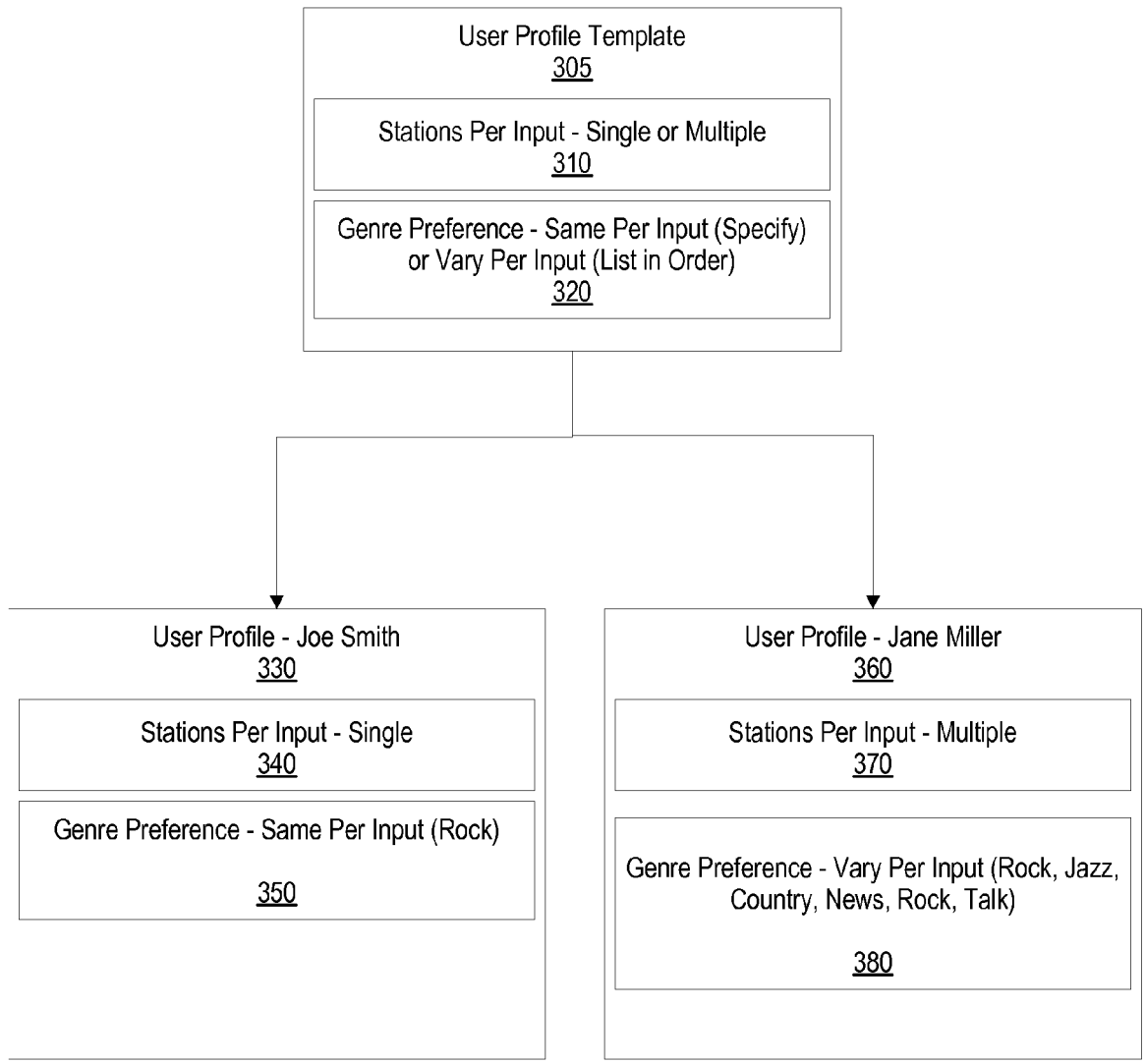
FIG. 3 is a diagram showing a user profile template and two exemplary user profiles.

User 150 includes user computer 160, upon which is stored user profile 165 (described in detail in FIG. 3). User profile 165 includes preference settings that detail the manner in which user 175 prefers to have media input devices programmed. User devices 180 may be any type of device, such as a pervasive device, where a user may wish to program the media device inputs. User devices 180 may include a portable radio, car radio, personal digital assistant (PDA), portable computer, etc. Device data 185 includes information such as the number of media device inputs that can be programmed, as well as whether or not the media device inputs can be programmed to multiple stations which may be toggled by user 175.

User profile 165 may also be stored on portable non-volatile storage 170 in order to allow user 175 to transport and use user profile 165 from other locations, such as while traveling. Portable non-volatile storage 170 may be a smart card or a memory area in a mobile telephone, PDA, or other such device. User 175 may store user profile 165 on portable non-volatile storage 170, thus allowing user profile 165 to be transmitted or downloaded to user devices 180 or to third party devices 140 (described below). For example, if non-volatile storage 170 is a smart card, user 175 may insert the smart card directly into user device 180 in order to download user profile 165 to user device 180.

Third party 125 may be any type of entity that provides third party devices 140 to customers, such as user 175. For example, third party 125 may be a hotel that provides a programmable radio to customers. Third party 125 may also be a car rental company that provides a programmable car radio in its rental cars. Third party devices 140 include device data 145 similar to device data 185. Third party computer 130 may be, for example, a hotel or car rental company computer. Third party computer 130 may keep a list of customer profiles 135, indicating preference settings, for its known customers. Third party computer 130 may also obtain a user profile via a web interface. For example, user 175 may upload user profile 165 to a known location on the Internet, such as a travel agent web site, or a web site maintained by third party 125. Third party computer 130 then obtains user profile 165 when user 175 makes a reservation for a hotel room or rental car. User 175 may also bring user profile 165 with him via portable non-volatile storage 170, whereupon user profile 165 may be downloaded or transmitted directly to third party device 140 or to third party computer 130. For example, if portable non-volatile storage 170 is a smart card, user 175 may insert the smart card directly into a radio in his hotel room in order to download user profile 165 to the radio. As another example, if portable non-volatile storage 170 is a memory area within a Bluetooth-enabled device, such as a PDA or cell phone, User 175 may transmit user profile 165 to third party computer 130, such as a computer in a rental car, thus providing third party computer 130 with information needed to program the media device inputs of third party devices 140, such as a car radio within the rental car.

Figure 2:
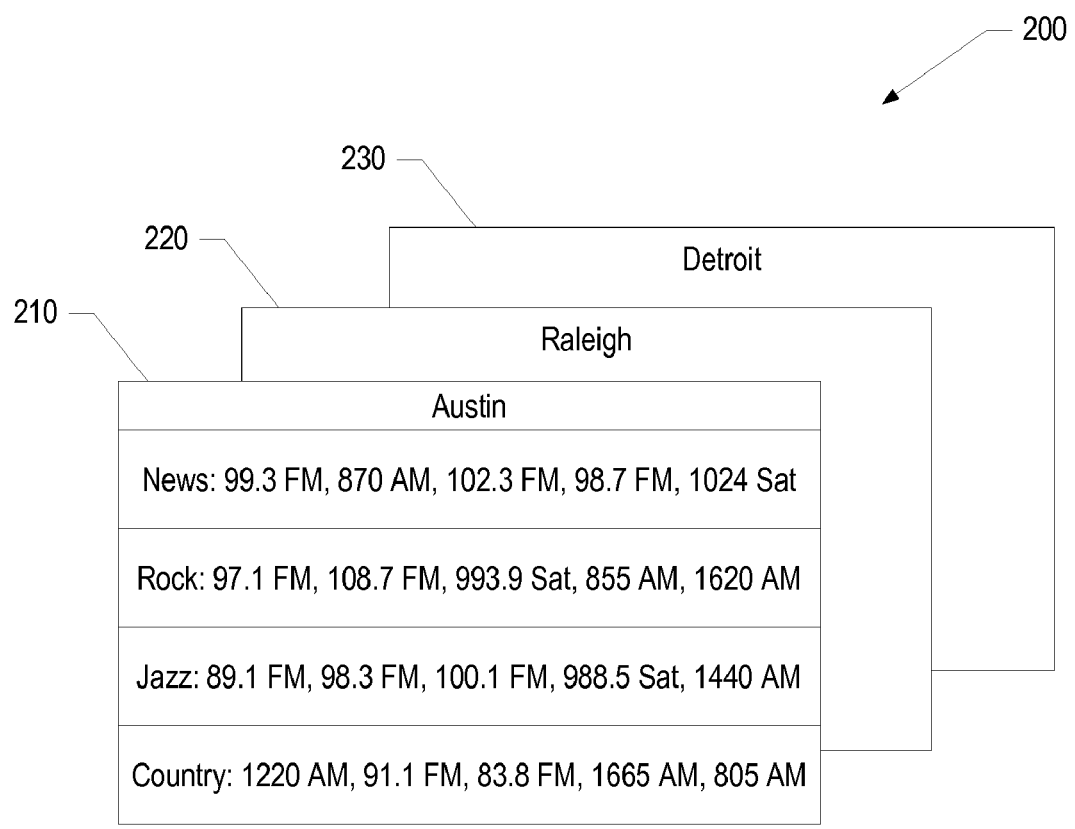
FIG. 2 is a diagram of station data, by geographic area.

FIG. 2 is a diagram of station data 200, by geographic area. Station data 200 may be collected by station data provider 115 (shown in FIG. 1), or may be collected by another entity and provided, either with or without a fee, to station data provider 115. Station data 200 is preferably collected and stored by geographic area. For example, station data record 210 stores station data for Austin, station data record 220 stores station data for Raleigh, and station data record 230 stores station data for Detroit.

As shown in station data record 210, the station data is preferably stored by genre. News stations are listed first in this example, followed by Rock stations, Jazz stations, and Country stations. Of course, station data 200 may be stored in any number of formats, and may include any number of genres (for example, soft rock, heavy metal, rap, blues, etc.). Station data 200 may also be listed in order of popularity, as determined by Nielson ratings or some other type of rating service. In this example, news station 99.3 FM is the most popular news station in Austin, followed by 870 AM, 102.3 FM, 98.7 FM, and 1024 Sat (a satellite news station).

Station data 200 is preferably updated on a regular basis, such as daily, weekly, or monthly. This allows a user to update the settings of media device inputs whenever it is desired in order to obtain, for example, the most popular stations of a particular genre. For example, a user, such as user 175, shown in FIG. 1, may re-program the media device inputs, i.e. the radio buttons, of his car radio once a week in order to obtain the most popular radio stations for his geographic area.

FIG. 3 is a diagram showing user profile template 305 and two exemplary user profiles, user profile 330 for Joe Smith, and user profile 360 for Jane Miller. User Profile Template 305 includes two preference settings—input preference setting 310 and genre preference setting 320. Any number of preference settings may be used. For example, an override preference setting may be used to allow a user to override the order of stations listed in the station data record for his geographic area in order to always program a particular media device input to a particular station. For example, a user may always want the first button on his car radio to be set to a particular radio station, regardless of the particular radio station's popularity rating. This preference could be indicated by an override preference setting. Those skilled in the art will understand that any variety of preference settings may be used, and each preference setting may include a variety of preference options, without departing from the scope of the present invention.

In the example shown in FIG. 3, input preference setting 310 indicates the number of stations to be programmed per media device input. Possible preferences include a single station per input, or multiple stations per input. As shown in exemplary user profiles 330 and 360, Joe Smith has selected an input preference setting 340 of a single station per media device input, while Jane Miller has selected an input preference setting 370 of multiple stations per media device input.

As further shown in FIG. 3, genre preference setting 320 includes an option to have each media device input set to the same genre (which is specified by the user), or to have each media device input set to a different genre (in which case, the user lists his genre preferences in order). As shown in exemplary user profiles 330 and 360, Joe Smith has selected a genre preference 350 of the same genre per input (i.e. Rock), while Jane Miller has selected a genre preference 380 that varies per media device input, and has listed the order in which she prefers media device inputs to be set.

Those skilled in the art will understand that a user may have several user profiles that he switches between depending on the circumstances. Also, a "user" is not limited to an individual, but may include any entity, such as a business entity. For example, a user may be a business that plays music received from satellite radio stations. Depending on which clients or customers are present, a different user profile may be used to reset the media device to play music preferred by the current client.

Figure 4:
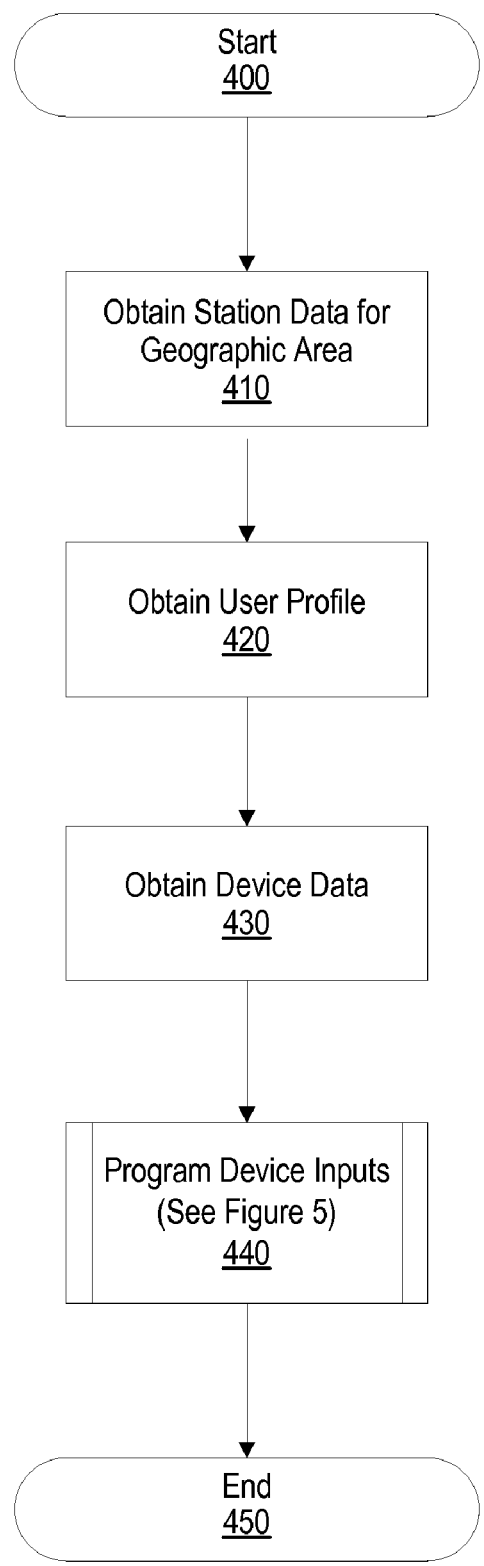
FIG. 4 is a flowchart showing the steps involved in setting media device inputs according to user preferences and media device capabilities.

FIG. 4 is a flowchart showing the steps involved in setting media device inputs according to user preferences and media device capabilities. Note that the setting of media device inputs may be accomplished by the media device itself, such as user devices 180 and third party devices 140, shown in FIG. 1. Alternately, the setting of media device inputs may be accomplished by a computer attached, either directly or via a network, to the media device, such as user computer 160 or third party computer 130, also shown in FIG. 1.

Processing commences at 400 whereupon station data is obtained for the particular geographic area in which the media device is located (step 410). The particular geographic area is determined using a technique such as the Global Positioning System (GPS) or cellular location technology. The user of the media device may also input the particular geographic area, such as city and state, into a menu or other input area. Station data for the particular geographic area is obtained from station data provider 115, as shown in FIG. 1. As discussed in FIG. 1, a fee may or may not be charged for the station data.

A user profile, such as user profile 330 or user profile 360 depicted in FIG. 3, is then obtained (step 420). A user profile may be obtained in a variety of ways, including, but not limited to, accessing a database of customer user profiles, via a web interface, a smart card, a wireless transmission (e.g., from a Bluetooth-enabled device, such as a cell phone or PDA), etc. Device data, such as device data 145 or device data 185 depicted in FIG. 1, is also obtained (step 430). Device data includes information regarding the capabilities of the media device, such as the number of media device inputs and whether or not the media device inputs can be set to multiple stations per input.

Figure 5:
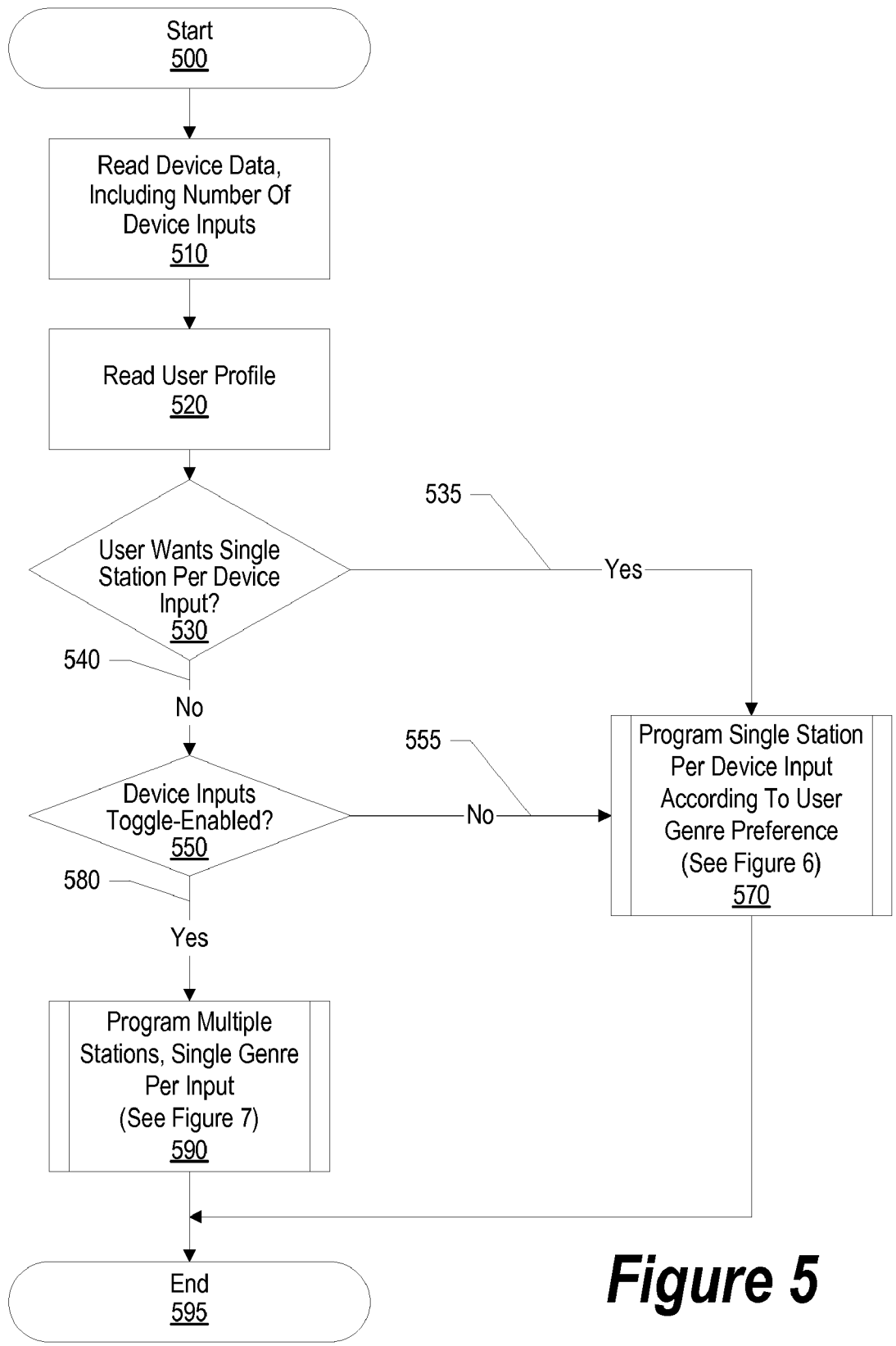
FIG. 5 is a flowchart showing the steps involved in programming media device inputs.

At this point, the media device inputs are programmed (predefined process 440) as shown in FIG. 5, and processing ends at 450. Note that media device inputs may set to receive data from a particular media source in a variety of ways known to those skilled in the art. For example, in order to set a radio button to receive input from a particular radio station, it may be necessary to tune the radio to a particular band (such as AM or FM), then tune the radio to the particular station, and then "set" the button to that station. Part of the media device's device data may also include specific instructions for setting media device inputs to receive particular input.

Figure 6:
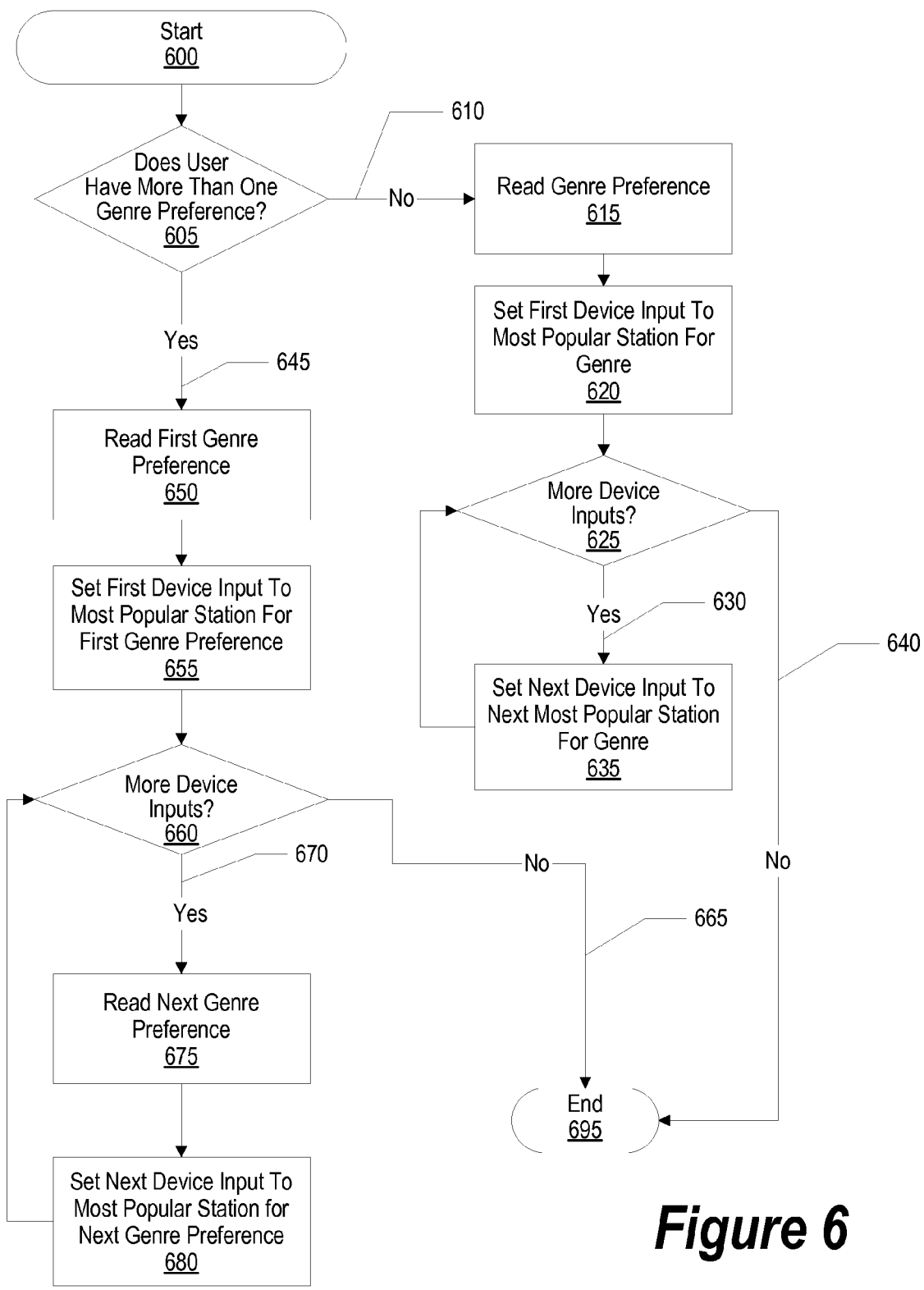
FIG. 6 is a flow diagram showing in detail the steps involved in programming a single station per device input according to a user's genre preference.
Figure 7:
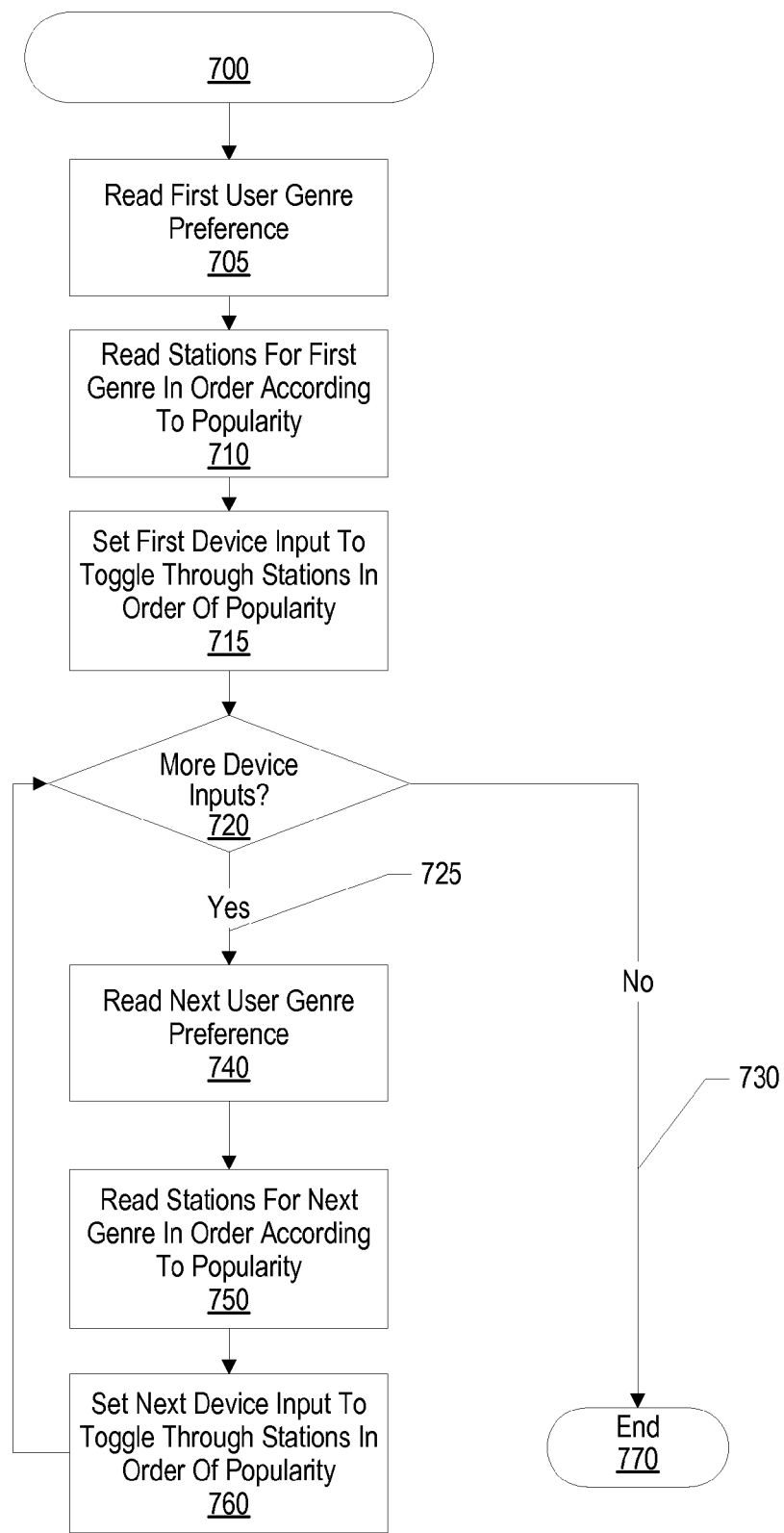
FIG. 7 is a flow diagram showing in detail the steps involved in programming multiple stations per device input according to a user's genre preferences.

FIG. 5 is a flowchart showing the steps involved in programming media device inputs. Processing commences at 500 whereupon the media device data, including the number of media device inputs, is read (step 510). The user profile is also read (step 520). Based on the input preference setting found in the user profile, a determination is made as to whether the user wants a single station per media device input (decision 530). If the input preference setting is set to indicate a single station per media device input, decision 530 branches to "yes" branch 535 whereupon a single station per media device input is programmed according to the user's genre preference (predefined process 570) as depicted in FIG. 6. Thereafter, processing ends at 595. Returning to decision 530, if, however, the input preference setting is not set to indicate a single station per media device input (meaning, in this example, that the user has set an input preference setting of multiple stations per media device input), decision 530 branches to "no" branch 540. At this point, a determination is made, based on the obtained device data, as to whether or not the media device inputs are toggle-enabled (decision 550). If the media device inputs are not toggle-enabled, decision 550 branches to "no" branch 555, whereupon a single station per media device input is programmed according to the user's genre preference (predefined process 570) as depicted in FIG. 6. If however, the media device inputs are toggle-enabled, decision 550 branches to "yes" branch 580 whereupon the media device inputs are programmed to multiple stations per device input, with a single genre per device input (predefined process 590) as depicted in FIG. 7. Thereafter, processing ends at 595.

FIG. 6 is a flow diagram showing, in detail, the steps involved in programming a single station per device input according to a user's genre preference or preferences. Processing commences at 600 whereupon, based on the user profile, a determination is made as to whether the user has more than one genre preference (decision 605). If the user does have more than one genre preference, decision 605 branches to "yes" branch 645, whereupon the user's first genre preference is read (step 650). The first media device input is then set to the most popular station for the first genre preference (step 655). The most popular station for a particular genre is determined by reading the obtained station data for the geographic area, as discussed with regard to FIG. 4. A determination is made as to whether there are more media device inputs to be programmed (decision 660). If there are no more media device inputs to be programmed, decision 660 branches to "no" branch 665, whereupon processing ends at 695. If, however, there are more media device inputs to be programmed, decision 660 branches to "yes" branch 670 whereupon the next genre preference is read from the user's profile. The next media device input is set to the most popular station for the next genre preference (step 680) whereupon processing returns to decision 660 to check for more device inputs. It is possible that the media device will have more device inputs than the user has genre preferences. If so, this can be handled in a variety of ways. For example, if the user has only specified three genre preferences and the media device has six inputs, two media device inputs may be set per genre (in any number of patterns). Alternately, either the user's first listed genre preference or last listed genre preference may be used to set "extra" media device inputs. Those skilled in the art will appreciate that any number of methods may be used to handle the situation where there are more (or fewer) media device inputs than listed genre preferences. It is also conceivable that not every genre preference is available in every geographic location, in which case it is preferable to simply ignore the unavailable genre type, or to substitute a similar genre type (for example, if a heavy metal radio station is not available in a particular geographic area, a hard rock station may be used instead).

Returning to decision 605, if it is determined that the user does not have more than one genre preference (meaning, in this example, that the user has a single genre preference), decision 605 branches to "no" branch 610 whereupon the user's genre preference is read from the user's profile (step 615). The first media device input is set to the most popular station for the particular genre preference (step 620). As discussed above, the most popular station for a particular genre is determined by reading the obtained station data for the geographic area. A determination is made as to whether there are more media device inputs to be programmed (decision 625). If there are no more media device inputs to be programmed decision 625 branches to "no" branch 640 whereupon processing ends at 695. If, however, there are more media device inputs to program, decision 625 branches to "yes" branch 630 whereupon the next device input is set to the next most popular station for the particular genre preference (step 635). Processing then returns to decision 625 to check for more media device inputs. It is possible that the media device may have more device inputs than there are stations available for the particular genre type specified by the user. Those skilled in the art will appreciate that this situation may be handled in a variety of ways. For example, some media device inputs may not be set to any station. Alternately, a similar genre type may be used to select stations for "extra" media device inputs.

FIG. 7 is a flow diagram showing in detail the steps involved in programming multiple stations per device input according to a user's genre preferences. Processing commences at 700 whereupon the user's first genre preference is read from the user profile (step 705). The stations for the first genre preference are read from the obtained station data, preferably in order according to popularity (step 710). As discussed above, if there are no stations for a particular genre type available in a geographic area, that particular genre type may be ignored, or a similar genre type may be substituted. The first media device input is then set to toggle through the stations in order of popularity (step 715).

Next, a determination is made as to whether there are more media device inputs to be programmed (decision 720). If there are no more media device inputs to be programmed, decision 720 branches to "no" branch 730 whereupon processing ends at 770. If, however, there are more media device inputs to be programmed, decision 720 branches to "yes" branch 725 whereupon the user's next genre preference is read from the user profile (step 740). The stations for the next genre preference are read from the obtained station data, preferably in order of popularity (step 750), The next media device input is set to toggle through the stations of the next genre preference in order of popularity (step 760). Processing then returns to decision 720 in order to check for more media device inputs to be programmed.

With regard to FIGS. 5 through 7, it is possible that other preference settings will affect the manner in which media device inputs are programmed. For example, if the user has specified an override preference setting, one or more media device inputs may be set to correspond to particular stations desired by the user, regardless of genre or popularity. Those skilled in the art will understand that any number of preference settings may be specified which will affect the exact manner in which media device inputs are set. The method shown in FIGS. 5 through 7 is meant to be an example of a preferred embodiment of the invention and is not meant to be limiting.

FIG. 8 is a diagram showing examples of programmed media device inputs. Device input examples 800 include three examples depicting radio buttons that have been programmed to particular stations based on a user profile and device capabilities. In example 810, the user profile indicated an input preference setting of one station per device input and a single genre preference of "rock." Based on the input preference setting and device capability, each radio button in example 810 has been set to a "rock" station, with station 105.9 FM being the most popular rock station for the geographic area, station 93.3 FM being the next most popular rock station, and so on.

In example 820, the user profile indicated an input preference setting of one station per device input and multiple genre preferences. Based on the input preference setting and the user's listed genre preferences, the radio buttons in example 820 have been set to news station 99.3 FM, jazz station 93.9 FM, etc., as shown. In example 830, the user profile indicated an input preference setting of multiple stations per device input, and multiple genre preferences. Based on the input preference setting and the user's listed genre preferences, the device inputs have been set as shown in example 830. The first radio button allows the user to toggle through several news stations, in order of popularity, the second radio button allows the user to toggle through several jazz stations in order of popularity, and so on.

Figure 9:
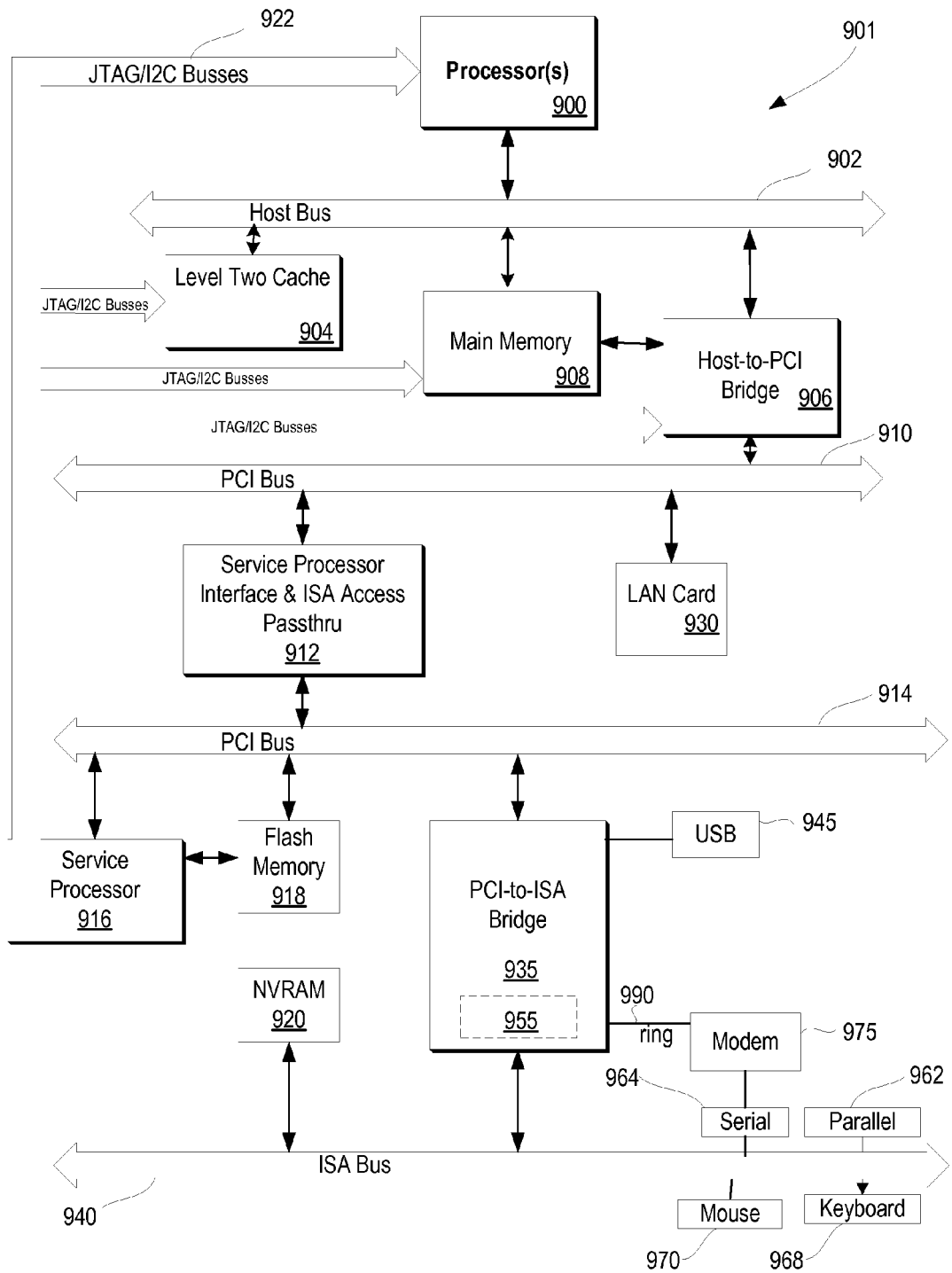
FIG. 9 is a block diagram of a computing device capable of implementing the present invention.

FIG. 9 illustrates information handling system 901 which is a simplified example of a computer system capable of performing the computing operations described herein. Computer system 901 includes processor 900 which is coupled to host bus 902. A level two (L2) cache memory 904 is also coupled to host bus 902. Host-to-PCI bridge 906 is coupled to main memory 908, includes cache memory and main memory control functions, and provides bus control to handle transfers among PCI bus 910, processor 900, L2 cache 904, main memory 908, and host bus 902. Main memory 908 is coupled to Host-to-PCI bridge 906 as well as host bus 902. Devices used solely by host processor(s) 900, such as LAN card 930, are coupled to PCI bus 910. Service Processor Interface and ISA Access Pass-through 912 provides an interface between PCI bus 910 and PCI bus 914. In this manner, PCI bus 914 is insulated from PCI bus 910. Devices, such as flash memory 918, are coupled to PCI bus 914. In one implementation, flash memory 918 includes BIOS code that incorporates the necessary processor executable code for a variety of low-level system functions and system boot functions.

PCI bus 914 provides an interface for a variety of devices that are shared by host processor(s) 900 and Service Processor 916 including, for example, flash memory 918. PCI-to-ISA bridge 935 provides bus control to handle transfers between PCI bus 914 and ISA bus 940, universal serial bus (USB) functionality 945, power management functionality 955, and can include other functional elements not shown, such as a real-time clock (RTC), DMA control, interrupt support, and system management bus support. Nonvolatile RAM 920 is attached to ISA Bus 940. Service Processor 916 includes JTAG and I2C busses 922 for communication with processor(s) 900 during initialization steps. JTAG/I2C busses 922 are also coupled to L2 cache 904, Host-to-PCI bridge 906, and main memory 908 providing a communications path between the processor, the Service Processor, the L2 cache, the Host-to-PCI bridge, and the main memory. Service Processor 916 also has access to system power resources for powering down information handling device 901.

Peripheral devices and input/output (I/O) devices can be attached to various interfaces (e.g., parallel interface 962, serial interface 964, keyboard interface 968, and mouse interface 970 coupled to ISA bus 940. Alternatively, many I/O devices can be accommodated by a super I/O controller (not shown) attached to ISA bus 940.

In order to attach computer system 901 to another computer system to copy files over a network, LAN card 930 is coupled to PCI bus 910. Similarly, to connect computer system 901 to an ISP to connect to the Internet using a telephone line connection, modem 975 is connected to serial port 964 and PCI-to-ISA Bridge 935.

While the computer system described in FIG. 9 is capable of executing the processes described herein, this computer system is simply one example of a computer system. Those skilled in the art will appreciate that many other computer system designs are capable of performing the processes described herein.

One of the preferred implementations of the invention is a client application, namely, a set of instructions (program code) in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention.

Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "aa" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

The invention claimed is:

1. An information handling system comprising:
   one or more processors;
   a memory accessible by the processors;
   a nonvolatile storage device accessible by the processors; and
   a media device input tool for setting media device inputs, the media device input tool being effective to:
      acquire a geographic location of a media device having the media device inputs;
      obtain station data corresponding to the acquired geographic location;
      receive media device data corresponding to the media device, wherein the media device data includes a number of media device inputs to be programmed;
      retrieve a user profile corresponding to a user of the media device, wherein the retrieved user profile includes an input preference setting of a single station per media device input and a single genre preference; and
      program the media device inputs based on the obtained station data and the retrieved user profile, wherein the programming comprises using the obtained station data to set each of the media device inputs to a media station of the single genre preference, and wherein the media device inputs are set in order of popularity.

2. The information handling system of claim 1 wherein the obtained station data includes a list of radio stations available in the geographic location, and wherein the obtained station data includes genre and popularity information for each radio station.

3. An information handling system comprising:
one or more processors;
a memory accessible by the processors;
a nonvolatile storage device accessible by the processors; and
a media device input tool for setting media device inputs, the media device input tool being effective to:
acquire a geographic location of a media device having the media device inputs;
obtain station data corresponding to the acquired geographic location;
receive media device data corresponding to the media device, wherein the media device data includes a number of media device inputs to be programmed;
retrieve a user profile corresponding to a user of the media device, wherein the retrieved user profile includes an input preference setting of a single station per device input and more than one genre preference; and
program the media device inputs based on the obtained station data and the retrieved user profile, wherein the programming is effective to:
a) read a first genre preference from the retrieved user profile;
b) obtain a most popular media station of the first genre preference from the obtained station data;
c) set a first media device input to the most popular media station of the first genre; and
d) repeat steps a, b, and c for each of the media device inputs.

4. The information handling system of claim 3 wherein the obtained station data includes a list of radio stations available in the geographic location, and wherein the obtained station data includes genre and popularity information for each radio station.

5. An information handling system comprising:
one or more processors;
a memory accessible by the processors;
a nonvolatile storage device accessible by the processors; and
a media device input tool for setting media device inputs, the media device input tool being effective to:
acquire a geographic location of a media device having the media device inputs;
obtain station data corresponding to the acquired geographic location;
receive media device data corresponding to the media device, wherein the media device data includes a number of media device inputs to be programmed;
retrieve a user profile corresponding to a user of the media device, wherein the retrieved user profile includes an input preference setting of multiple stations per media device input;
determine, based on the received media device data, that the media device inputs are toggle-enabled; and
in response to the determining:
read a first genre preference from the retrieved user profile;
obtain a first list of media stations of the first genre preference; and
set a first media device input to toggle through the first list of obtained media stations.

6. The information handling system of claim 5 wherein the obtained station data includes a list of radio stations available in the geographic location, and wherein the obtained station data includes genre and popularity information for each radio station.

7. The information handling system of claim 5 wherein the media device input tool is further effective to:
read a second genre preference from the retrieved user profile;
obtain a second list of media stations of the second genre preference; and
set a second media device input to toggle through the second list of obtained media stations.

8. The information handling system of claim 5 wherein the obtained first list of media stations is in order of popularity.

9. A computer program product stored on a computer operable media, the computer operable media containing instructions for execution by a computer, which, when executed by the computer, cause the computer to implement a method for setting media device inputs, the method comprising:
acquiring a geographic location of a media device having the media device inputs;
obtaining station data corresponding to the acquired geographic location;
receiving media device data corresponding to the media device, wherein the media device data includes a number of media device inputs to be programmed;
retrieving a user profile corresponding to a user of the media device, wherein the retrieved user profile includes an input preference setting of a single station per media device input and a single genre preference; and
programming the media device inputs based on the obtained station data and the retrieved user profile, wherein the programming comprises using the obtained station data to set each of the media device inputs to a media station of the single genre preference, and wherein the media device inputs are set in order of popularity.

10. The computer program product of claim 9 wherein the obtained station data includes a list of radio stations available in the geographic location, and wherein the obtained station data includes genre and popularity information for each radio station.

11. A computer program product stored on a computer operable media, the computer operable media containing instructions for execution by a computer, which, when executed by the computer, cause the computer to implement a method for setting media device inputs, the method comprising:
acquiring a geographic location of a media device having the media device inputs;
obtaining station data corresponding to the acquired geographic location;
receiving media device data corresponding to the media device, wherein the media device data includes a number of media device inputs to be programmed;
retrieving a user profile corresponding to a user of the media device, wherein the retrieved user profile includes an input preference setting of a single station per device input and more than one genre preference; and
programming the media device inputs based on the obtained station data and the retrieved user profile, wherein the programming comprises:
a) reading a first genre preference from the retrieved user profile;
b) obtaining a most popular media station of the first genre preference from the obtained station data;
c) setting a first media device input to the most popular media station of the first genre; and d) repeating steps a, b, and c for each of the media device inputs.

12. The computer program product of claim 11 wherein the obtained station data includes a list of radio stations available in the geographic location, and wherein the obtained station data includes genre and popularity information for each radio station.

13. A computer program product stored on a computer operable media, the computer operable media containing instructions for execution by a computer, which, when executed by the computer, cause the computer to implement a method for setting media device inputs, the method comprising:

acquiring a geographic location of a media device having the media device inputs;

obtaining station data corresponding to the acquired geographic location;

receiving media device data corresponding to the media device, wherein the media device data includes a number of media device inputs to be programmed;

retrieving a user profile corresponding to a user of the media device, wherein the retrieved user profile includes an input preference setting of multiple stations per media device input;

determining, based on the received media device data, that the media device inputs are toggle-enabled; and in response to the determining:

reading a first genre preference from the retrieved user profile;

obtaining a first list of media stations of the first genre preference; and setting a first media device input to toggle through the first list of obtained media stations.

14. The computer program product of claim 13 wherein the obtained station data includes a list of radio stations available in the geographic location, and wherein the obtained station data includes genre and popularity information for each radio station.

15. The computer program product of claim 13 wherein the method further comprises:

reading a second genre preference from the retrieved user profile;

obtaining a second list of media stations of the second genre preference; and setting a second media device input to toggle through the second list of obtained media stations.

16. The computer program product of claim 13 wherein the obtained first list of media stations is in order of popularity.

* * * * *